United States Patent
Main et al.

[11] Patent Number: 5,729,176
[45] Date of Patent: Mar. 17, 1998

[54] LINEAR DIFFERENTIAL GAIN STAGE

[75] Inventors: William Eric Main, Mesa; Jeffrey C. Durec, Chandler, both of Ariz.

[73] Assignee: Motorola, Inc., Schaumburg, Ill.

[21] Appl. No.: 642,378

[22] Filed: May 3, 1996

[51] Int. Cl.$^6$ .................. H03F 3/45; H03F 1/14
[52] U.S. Cl. .................. 330/252; 330/149; 330/76; 330/260; 330/292
[58] Field of Search ............ 330/76, 78, 149, 330/252, 260, 292

[56] References Cited

U.S. PATENT DOCUMENTS

| | | | |
|---|---|---|---|
| 4,390,848 | 6/1983 | Blauschild | 330/252 X |
| 4,763,024 | 8/1988 | Gay | 307/493 |
| 5,365,191 | 11/1994 | Hayashi | 330/252 |
| 5,453,718 | 9/1995 | Kurokawa | 330/292 X |
| 5,493,254 | 2/1996 | Fairgrieve | 330/292 X |

FOREIGN PATENT DOCUMENTS 98307 4/1989 Japan ................. 330/252

*Primary Examiner*—James B. Mullins
*Attorney, Agent, or Firm*—Gary W. Hoshizaki; Sharon K. Coleman

[57] ABSTRACT

A linear differential gain stage (31) has a first input (32), a second input (33), a first output (34), and a second output (35). A differential input voltage is coupled to an input differential transistor pair (39,40). Voltage compensation circuits (53,54) cancel non-linearities due to the input differential transistor pair (39,40). Parasitic capacitance of the input differential transistor pair (39,40) couple current to the first and second inputs (32,33) due to voltage transitions at the first and second outputs (34,35). The current to the first and second inputs (32,33) is canceled by impedance compensation circuits (55,56) that provide an equal magnitude but opposite sign current. The result is an almost infinite input impedance to the linear differential gain stage (31).

15 Claims, 1 Drawing Sheet

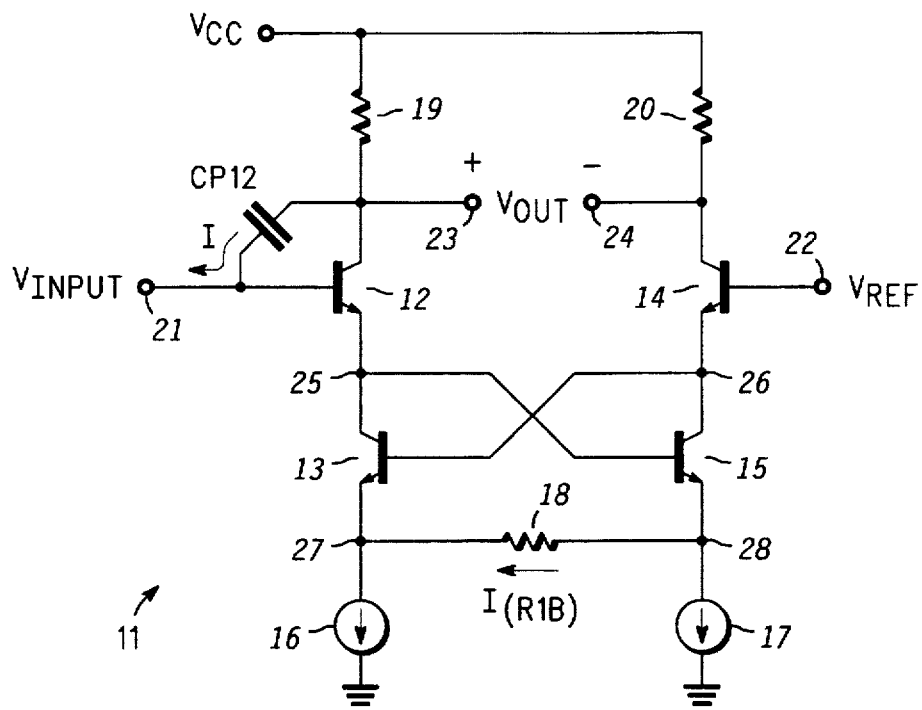
FIG. 1 – PRIOR ART –
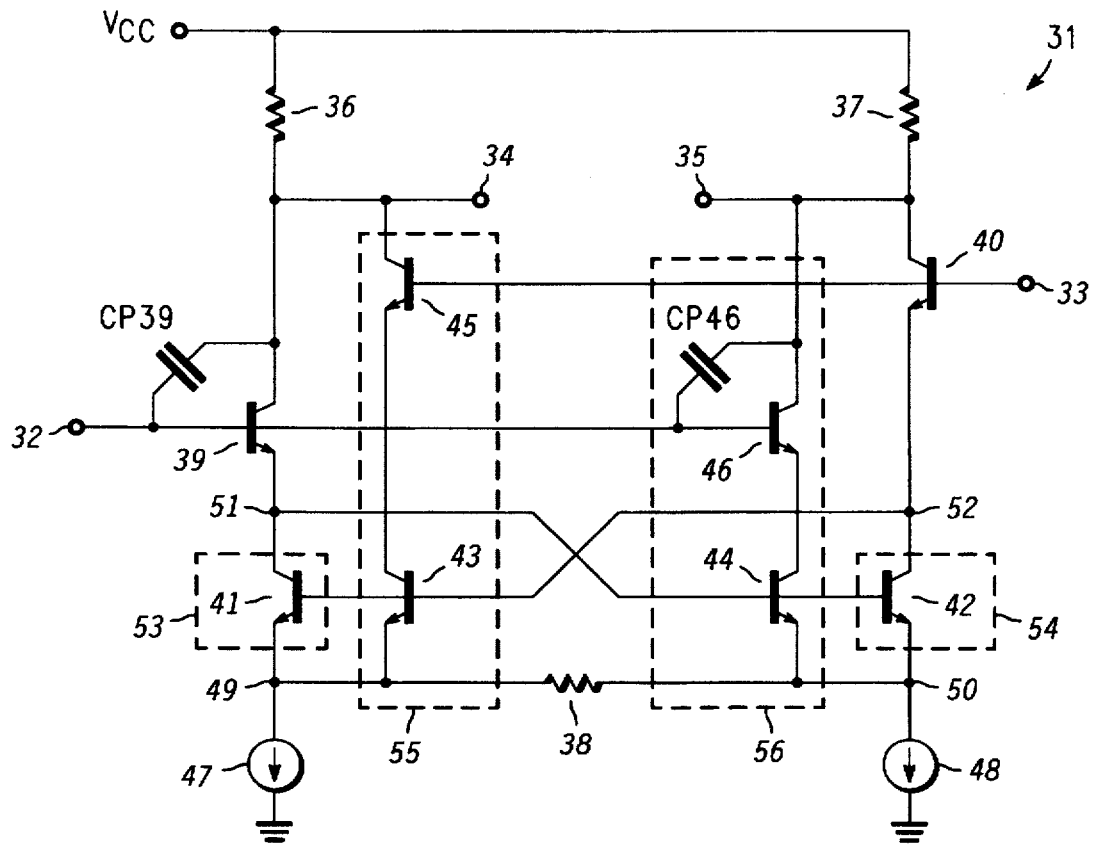
FIG. 2

LINEAR DIFFERENTIAL GAIN STAGE

BACKGROUND OF THE INVENTION

This invention relates, in general, to amplifiers, and more particularly, to linear differential gain stages.

A linear differential gain stage produces an output signal that is a linear function of an applied input signal. A problem with a linear differential gain stage is that they are formed with devices having non-linear characteristics such as transistors. Non-linearity in a gain stage produces distortion that affects circuit performance.

One technique to linearize a gain stage is the use degeneration resistors. Degeneration resistors minimize the change produced by non-linear devices thereby increasing linearity. Other techniques involve canceling non-linearities with an equal but opposite signal.

An example where linearity is critical to an application is in the design of an IF gain block for a high frequency (900 megahertz (MHZ)) cordless phone. In the past, selectivity placed before the IF blocks eliminated unwanted intermodulation effects between channels. For a 900 MHZ phone application, any non-linearity in the IF block coupled with leakage between channels produces third order intermodulation effects between adjacent channels and the selected channel. The result is a loss of sensitivity for the channel.

It would be of great benefit if a differential gain stage could be provided having a linear transfer function to minimize non-linearities produced by the differential gain stage.

BRIEF DESCRIPTION OF THE DRAWINGS

FIG. 1 is a prior art schematic diagram of a linear differential gain stage; and FIG. 2 is a schematic diagram of a linear differential gain stage in accordance with the present invention.

DETAILED DESCRIPTION OF THE DRAWINGS

FIG. 1 is a prior art schematic diagram of a linear differential gain stage 11. Linear differential gain stage 11 comprises transistors 12, 13, 14, and 15, resistors 18, 19, and 20, and current sources 16 and 17. Transistors 13 and 15 are added to linear differential gain stage 11 to cancel non-linearities produced by transistors 12 and 14.

In an embodiment of linear differential gain stage 11, transistors 12–15 have equal conductive areas such that each transistor performs identically under equal conditions. Similarly, resistors 19 (R19) and 20 (R20) have equal resistance and current sources 16 and 17 provide equal currents.

Linear differential gain stage 11 has a transfer function as indicated in equation 1;

$$Vout = Vin * 2(R19/R18) \quad (1)$$

where Vin is a differential voltage applied across inputs 21 and 22, where R18 is resistor 18, and where R19 equals R20. Note that the transfer function is a linear function corresponding to a resistor ratio and is independent of the non-linear operation of transistors 12–15.

Operation of linear differential gain stage 11 is described hereinafter. Transistors 12 and 15 are in a voltage follower configuration. Transistor 12 is biased by current from current source 16 while transistor 15 is biased by current from current source 17. Similarly, transistors 14 and 13 are in a voltage follower configuration. Transistor 14 is biased by current from current source 17 while transistor 13 is biased by current from current source 16.

As is well known, transistors in a voltage follower configuration "follow" an applied input voltage. Linear differential gain stage 11 as shown has inputs 21 and 22. Input 22 is coupled to a reference voltage Vref. A differential voltage is produced across inputs 21 and 22 when an input voltage applied to input 21 differs from the reference voltage Vref. Transistors 14 and 13 follow the reference voltage Vref such that a voltage at a node 26 and a node 27 is respectively level shifted by the base-emitter junction voltages of transistor 14 and 13. Transistors 12 and 15 follow the input voltage applied to input 21 such that a voltage at a node 25 and a node 28 is respectively level shifted by the base-emitter junction voltages of transistor 12 and 15.

Under quiescent conditions where the input voltage applied to input 21 is equal to the reference voltage Vref, the base-emitter junction voltages of transistors 12–15 are equal. Current from current source 16 biases transistors 12 and 13 which is equal to the current from current source 17 biasing transistors 14 and 15.

Transistors 12 and 14 have different base-emitter junction voltages when a differential voltage is applied across inputs 21 and 22. The difference in base-emitter junction voltages is compensated by transistors 13 and 15 such that the combined voltage across the base-emitter junctions of transistors 12 and 15 equals the combined voltage across the base-emitter junctions of transistors 14 and 13. For example, assume an input voltage is applied to input 21 that is greater than the reference voltage Vref. The input voltage (Vinput) produces a differential voltage that is amplified by linear differential gain stage 11. The differential voltage is coupled by transistors 12 and 15 to node 28 such that the differential voltage is applied across resistor 18. A current is generated through resistor 18 corresponding to the differential voltage.

Transistor 13 (T13) and transistor 12 (T12) (serially connected) are biased by the same current, thus transistors 12 and 13 have equal base-emitter junction voltages (Vbe (T13)=Vbe(T12)). Similarly, Transistor 15 (T15) and transistor 14 (T14) are biased by the same current, thus transistors 14 and 15 have equal base-emitter junction voltages (Vbe(T15)=Vbe(T14)). The voltage at node 28 is described by equation 2.

$$V(node\ 28) = Vinput - Vbe(T12) - Vbe(T15) \quad (2)$$

The voltage at node 27 is described by equation 3.

$$V(node\ 27) = Vref - Vbe(T14) - Vbe(T13) \quad (3)$$

The differential voltage across resistor 18 (V(R18)) is the voltage at node 27 minus the voltage at node 28. Equation 4 illustrates the cancellation of the non-linear base-emitter junction voltages of transistors 12–15, $$V(R18) = (Vinput - Vref) - (Vbe(T12) - Vbe(T13)) - (Vbe(T15) - Vbe(T14)) \quad (4)$$

since Vbe(T12)=Vbe(T13) and Vbe(T14)=Vbe(T15) equation 4 reduces to equation 5.

$$V(R18) = Vinput - Vref \quad (5)$$

Thus, the differential voltage is applied across resistor 18 and non-linearities are canceled. The current flowing through resistor 18 (I(R18)) is described by equation 6.

$$I(R18)=(Vinput-Vref)/R18 \qquad (6)$$

A bias current (Ib1) which biases transistors 12 and 13 is reduced by the current of resistor 18. Equation 7 describes the bias current in transistors 12 and 13. Ics16 is the current of current source 16.

$$Ib1=Ics16-I(R18) \qquad (7)$$

A bias current (Ib2) which biases transistors 14 and 15 is increased by the current of resistor 18. Equation 8 describes the bias current in transistors 14 and 15. Ics17 is the current of current source 17.

$$Ib2=Ics17+I(R18) \qquad (8)$$

An output differential voltage Vout is produced across the outputs 23 and 24. In the example, the voltage across resistor 19 (R19) at output 23 decreases by I(R18)*R19 due to the decrease in bias current Ib1 (increasing the voltage at output 23). Conversely, the voltage across resistor 20 (R20) increases by I(R18)*R20 due to the increase in bias current Ib2 (decreasing the voltage at output 24. The net voltage change across outputs 23 and 24 is defined in equation 9 where R19 equals R20.

$$Vout=2* I(R18) * R19 \qquad (9)$$

In general, linear differential gain stage 11 is one stage of many in a complex circuit, for example an IF gain block. Linear differential gain stage 11 impacts performance of a circuit if the inputs are coupled to a high input impedance. The problem is due to a negative input impedance of linear differential gain stage 11. The negative input impedance is described using the input parameters of the example described hereinabove. The input voltage applied to input 21 is greater than the reference voltage Vref applied to input 22. Transistor 12 has a parasitic capacitance CP12 across the collector-base junction. The input voltage applied to input 21 produces an increase in voltage at output 23. The positive change in voltage (dv/dt) across the collector-base junction of transistor 12 produces a current I through parasitic capacitance CP12 as indicated in FIG. 1. As is well known by one skilled in the art, the input impedance of a circuit is equal to dv/di where dv is the change in the input voltage and di is the change in the input current. In a typical differential input stage a positive change in input voltage would produce an increase in input current corresponding to an positive input impedance. Linear differential gain stage 11 produces the opposite result. A positive change in input voltage produces a decrease in input current, in fact, an input current is produced that flows out the input due to the Miller multiplication effect of parasitic capacitance CP12. In other words, a negative input impedance results in linear differential gain stage 11 which is normally unwanted because it may cause instability and reduced bandwidth.

FIG. 2 is a schematic diagram of a linear differential gain stage 31 in accordance with the present invention. Linear differential gain stage 31 does not have a negative input impedance yet cancels non-linearities in the circuit. Linear differential gain stage 31 has an input 32, an input 33, an output 34, and an output 35. A differential input voltage is applied across inputs 32 and 33 which produces an amplified output differential voltage at outputs 34 and 35.

Linear differential gain stage 31 comprises transistors 39, 40, 41, 42, 43, 44, 45, and 46, resistors 36, 37, and 38, and current sources 47 and 48. In an embodiment of linear differential gain stage 31, transistors 39–46 are bipolar NPN transistors having a collector, base, and emitter respectively corresponding to a first electrode, a control electrode, and a second electrode.

Transistors 39 and 40 are an input differential transistor pair. Transistor 39 has a collector connected to output 34, a base connected to input 32, and an emitter connected to a node 51. Transistor 40 has a collector connected to output 35, a base connected to input 33, and an emitter connected to a node 52.

Resistors 36 and 37 are load resistors respectively for transistors 39 and 40. Resistor 36 has a first terminal connected to a power supply terminal Vcc (for receiving a power supply voltage), and a second terminal connected to output 34. Resistor 37 has a first terminal connected to the power supply terminal Vcc and a second terminal connected to output 35.

A voltage compensation circuit 53 compensates for the non-linear voltage change in the base-emitter junction of transistor 40. Voltage compensation circuit 53 comprises transistor 41. Transistor 41 has a collector connected to node 51, a base connected to node 52, and an emitter connected to a node 49.

A voltage compensation circuit 54 compensates for the non-linear voltage change in the base-emitter junction of transistor 39. Voltage compensation circuit 54 comprises transistor 42. Transistor 42 has a collector connected to node 52, a base connected to node 51, and an emitter connected to a node 50.

Transistors 39 and 40 operate at different currents when a differential input voltage is applied across inputs 32 and 33. The different operating currents produce different base-emitter junction voltages in the input differential transistor pair which introduces non-linearities to the circuit. Voltage compensation circuits 53 and 54 cancel the non-linear effects due to the different operating conditions of the input differential transistor pair.

The input differential voltage of linear differential gain stage 31 is applied across resistor 38. Resistor 38 has a first terminal connected to node 49 and a second terminal connected to node 50. In an embodiment of linear differential gain stage 31 transistors 39 and 42 are in a voltage follower configuration applying an input voltage applied to input 32 to node 50 (albeit level shifted by the base-emitter junction voltages). Similarly, transistors 40 and 41 are in a voltage follower configuration applying an input voltage applied to input 33 to node 49. Transistors 39, 40, 41, and 42 have equal conductive areas (emitter areas) such that each transistor operates identically under equal conditions. Transistors 40 and 41 are configured to operate at different currents when a differential voltage is applied across inputs 32 and 33. Transistors 39 and 42 operate at different currents when a differential voltage is applied across inputs 32 and 33. The base-emitter junction voltage of transistors 39 and 41 are equal and the base-emitter junction voltage of transistors 40 and 42 are equal. The combined base-emitter junction voltages of transistors 39 and 42 are equal to the combined base-emitter junction voltages of transistors 40 and 41, thus canceling transistor non-linearities.

Current source 47 provides a current for biasing transistors 39 and 41. Current source 47 has a first terminal connected to node 49 and a second terminal connected to a power supply terminal Ground (for receiving a power supply voltage).

Current source 48 provides a current for biasing transistors 40 and 42. Current source 48 has a first terminal connected to node 50 and a second terminal connected to the power supply terminal Ground.

An alternate circuit (not shown) to bias linear differential gain stage 31 which utilizes a single current source requires two resistors. Resistor 38 is replaced with two resistors having equal values. A first resistor and a second resistor are coupled in series between nodes 49 and 50. The single current source is coupled to the common node between the first and second resistors. In a quiescent condition equal currents flow through the first and second resistors.

An impedance compensation circuit 56 comprises transistors 44 and 46. Impedance compensation circuit 56 changes the impedance at input 32 from a negative input impedance to an almost infinite impedance. Transistor 44 has a collector, a base connected to node 51 and an emitter connected to node 50. Transistor 46 has a collector connected to output 35, a base connected to input 32, and an emitter connected to the collector of transistor 44.

An impedance compensation circuit 55 comprises transistors 43 and 45. Impedance compensation circuit 55 changes the impedance at input 33 from a negative input impedance to an almost infinite impedance. Transistor 43 has a collector, a base connected to node 52, and an emitter connected to node 49. Transistor 45 has a collector connected to output 34, a base connected to input 33, and an emitter connected to the collector of transistor 43.

In an embodiment of linear differential gains stage 31, transistors 39–46 are matched and have equal conductive areas such that each transistor performs identically under equal conditions. Transistors 41 and 43 are connected to have equal base-emitter junction voltages. Similarly, transistors 42 and 44 are connected to have equal base-emitter junction voltages. Under quiescent conditions (the voltage at inputs 32 and 33 are equal) one half the current from current source 47 is conducted by transistor 41 and the other half conducted by transistor 43. Similarly, one half the current from current source 48 is conducted by transistor 42 and the other half conducted by transistor 44. The voltage at outputs 34 and 35 are equal under the quiescent condition.

A differential voltage applied across inputs 32 and 33 produce a current through resistor 38. The result of the differential voltage is to produce an increase/decrease in current in a first side of linear differential gain stage 31 and a corresponding decrease/increase in current in a second side. The first side of linear differential gain stage 31 comprises transistors 39, 41, 43, and 45, and resistor 36. The second side of linear differential gain stage 31 comprises transistors 40, 42, 44, and 46, and resistor 37.

For example, a differential voltage is applied across inputs 32 and 33 such that the voltage at input 32 increases a voltage +dvin and the voltage at input 33 decreases by a voltage −dvin. Transistors 39 and 40 are in a voltage follower configuration coupling the change in input voltage respectively to nodes 51 and 52. Transistors 42 and 44 are in a voltage follower configuration coupling the change in voltage at node 51 to node 50. Similarly, transistors 41 and 43 are in a voltage follower configuration coupling the change in voltage at node 52 to node 49.

Transistors 40 and 42 are serially connected to conduct the same current thus having equal base-emitter junction voltages. Transistors 39 and 41 (T39, T41) are serially connected to conduct the same current thus having equal base-emitter junction voltages. The combined base-emitter junction voltages of transistors 39 and 42 equals the combined base-emitter junction voltages of transistors 40 and 41 canceling non-linearities. The differential voltage applied to inputs 32 and 33 equals the voltage applied across resistor 38 (R38). The current through resistor 38 is described by equation 10.

$$I(R38)=(2*dvin)/R38 \quad (10)$$

The current coupled through the first side of linear differential gain stage 31 is reduced by the current I(R38). The current is divided equally between transistors 41 and 43 but provided to load resistor 36 by transistors 39 and 45. The voltage increase at output 34 (+dvout) is described in equation (11).

$$+dvout=I(R38)*R36 \quad (11)$$

The current coupled through the second side of linear differential gain stage 31 increases by the current I(R38). The current is divided equally between transistors 42 and 44 but provided to load resistor 37 by transistors 40 and 46. The voltage decrease at output 35 (−dvout) is described in equation 12.

$$-dvout=I(R38)*R37 \quad (12)$$

In an embodiment of linear differential gain stage 31 resistors 36 and 37 have equal resistance such that the magnitude of voltage change as described in equations 11 and 12 are equal. The voltage gain (Vout/Vin) of linear differential gain stage 31 is described in equation 13 using equations 10–12.

$$Vout/Vin=I(R38)*(R36+R37)/(I(R38)*R38)=2*R36/R38 \text{ where } (R36=R37) \quad (13)$$

Thus, the gain of linear differential gain stage is a function of a resistor ratio.

A description of the input impedance of linear differential gain stage 31 is described for input 32 but the circuit is symmetrical and thus the description equally applies to input 33. A parasitic capacitance CP39 is coupled across the collector-base junction of transistor 39. As described hereinabove, a positive voltage transition at input 32 produces an amplified positive voltage change at output 34 of linear differential gain stage 31. The change in voltage at output 34 is described in equation 11.

The input impedance at input 32 is the change in input voltage (+dvin) divided by the change in input current. For example, the positive voltage transition at input 32 would be expected to increase input current (a positive current) to transistor 39. Due to the circuit topology of linear differential gain stage 31 in canceling non-linearities this does not occur. The current coupled by parasitic capacitance CP39 to input 32 corresponds to the equation I=C*(dv/dt) as is well known by one skilled in the art. In fact, the positive transition at output 34 produces a current through parasitic capacitance CP39 that can flow out of input 32 (a negative current). The result is a negative impedance at input 32 that can affect a previous circuit stage that is coupled to inputs 32 and 33 of linear differential gain stage 31.

A negative impedance is changed to a positive impedance in linear differential gain stage 31 using impedance compensation circuits 55 and 56. In fact, the input impedance of input differential transistor pair (transistors 39 and 40) is increased to an extremely high impedance thereby reducing loading on a previous stage driving inputs 32 and 33. The change and increase in impedance is accomplished by canceling the input current to transistor 39 with an input compensation current generated from the voltage change at output 35. The voltage change at output 35 is equal and opposite to the voltage change at output 34 that produces the input current of transistor 39. The input compensation current is coupled to the base of transistor 39 such that each cancels one another. Similarly, the input current to transistor 40 is canceled by an input compensation current generated from the voltage change at output 34. The voltage change at output 34 is equal and opposite to the voltage change at output 35 that produces the input current of transistor 40. The input compensation current is coupled to the base of transistor 40 such that each cancels one another.

Also, the base current of transistors 39 and 40 changes as an input differential voltage is applied to inputs 32 and 33. A base current change corresponds to a change in current (collector/emitter current) conducted by the device due to the input differential voltage. The change in base current of transistors 39 and 40 are respectively canceled by transistors 46 and 45. The total base current at input 32 is the combined base currents of transistors 39 and 46. Similarly, the total base current at input 33 is the combined base currents of transistors 40 and 45 For example, transistor 46 undergoes an approximately equal but opposite change in current thereby producing a change in base current that cancels the change in base current produced by transistor 39. The result is almost no change in the combined base current at input 32 when a differential voltage is applied linear differential gain stage 31. An extremely high input impedance is maintained due to the base current cancellation at inputs 32 and 33. A similar cancellation occurs between the base currents of transistors 40 and 45.

Impedance compensation circuit 56 cancels the negative current coupled through parasitic CP39 by generating an equal magnitude but opposite polarity current. Transistor 46 has an equal conductive area as transistor 39 as stated hereinabove, thus transistor 46 has a parasitic capacitance CP46 substantially equal to parasitic capacitance CP39. Transistor 46 is biased by current provided by transistor 44. The collector is connected to output 35 while the base of transistor 46 is connected to input 32. In other words, the parasitic capacitance CP46 couples output 35 to input 32. Output 35 undergoes an opposite voltage transition as output 34 as indicated in equation 11. The result of the equal magnitude but opposite voltage transition is to produce a positive current at input 32 through parasitic capacitance CP46 that cancels the negative current at input 32 through parasitic capacitance 39. If the currents exactly cancel, no change in input current at input 32 occurs which yields an extremely high input impedance.

Similarly, impedance compensation circuit 55 produces a positive current that cancels a negative current produced at input 33 across the collector-base junction of transistor 40.

By now it should be appreciated that a linear differential gain stage has been provided. The linear differential gain stage cancels non-linearities of the circuit while increasing the input impedance. An impedance compensation circuit provides an equal magnitude but opposite polarity current to the input to cancel a current coupled through a parasitic capacitance of an input transistor.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A linear differential gain stage having a first input, a second input, a first output, and a second output comprising:

a first transistor having a first electrode coupled to the first output, a control electrode coupled to the first input, and a second electrode;

a second transistor having a first electrode coupled to said second electrode of said first transistor, a control electrode, and a second electrode;

a first current source having a first terminal coupled to said second electrode of said second transistor and a second terminal coupled to a first power supply terminal for receiving a first power supply voltage;

a third transistor having a first electrode coupled to the second output, a control electrode coupled to the second input, and a second electrode coupled to said control electrode of said second transistor;

a fourth transistor having a first electrode coupled to said second electrode of said third transistor, a control electrode coupled to said second electrode of said first transistor, and a second electrode;

a second current source having a first terminal coupled to said second electrode of said fourth transistor and a second terminal coupled to said first power supply terminal;

a first resistor having a first terminal coupled to said second electrode of said second transistor and a second terminal coupled to said second electrode of said fourth transistor;

a fifth transistor having a first electrode coupled to the first output, a control electrode coupled to the second input, and a second electrode; and a sixth transistor having a first electrode coupled to said second electrode of said fifth transistor, a control electrode coupled to said second electrode of said third transistor, and a second electrode coupled to said second electrode of said second transistor.

2. The linear differential gain stage of claim 1 further including:

a seventh transistor having a first electrode coupled to the second output, a control electrode coupled to the first input, and a second electrode; and an eighth transistor having a first electrode coupled to said second electrode of said seventh transistor, a control electrode coupled to said second electrode of said first transistor, and a second electrode coupled to said second electrode of said fourth transistor.

3. The linear differential gain stage of claim 2 further including:

a second resistor having a first terminal coupled to a second power supply terminal for receiving a second power supply voltage and a second terminal coupled to the first output; and a third resistor having a first terminal coupled to the second power supply terminal and a second terminal coupled to the second output.

4. The linear differential gain stage of claim 3 wherein said first, third, fifth, and seventh transistors have equal conductive areas.

5. The linear differential gain stage of claim 4 wherein said second, fourth, sixth, and eighth transistors have equal conductive areas.

6. A linear differential gain stage having a first input, a second input, a first output, and a second output, the linear differential gain stage comprising:

an input differential transistor pair responsive to an input differential voltage applied to the first and second inputs of the linear differential gain stage wherein the input differential transistor pair comprises:

a first transistor having a first electrode coupled to the first output, a control electrode coupled to the first input, and a second electrode; and a second transistor having a first electrode coupled to the second output, a control electrode coupled to the second input, and a second electrode;

a first load resistor responsive to said input differential transistor pair for generating a first output voltage at the first output;

a second load resistor responsive to said input differential transistor pair for generating a second output voltage at the second output wherein an output differential voltage is a voltage difference of the first and second output voltages;

a first impedance compensation circuit responsive to said output differential voltage for canceling a change in a first input current to said input differential transistor pair;

a second impedance compensation circuit responsive to said output differential voltage for canceling a change in a second input current to said input differential transistor pair;

a first transistor of the linear differential gain stage having a first electrode coupled to said second electrode of said first transistor of said input differential transistor pair, a control electrode coupled to said second electrode of said second transistor of said input differential transistor pair, and a second electrode; and a second transistor of the linear differential gain stage having a first electrode coupled to said second electrode of said second transistor of said input differential transistor pair, a control electrode coupled to said second electrode of said first transistor of said input differential transistor pair, and a second electrode.

7. The linear differential gain stage as recited in claim 6 wherein said first and second load resistors have equal resistance.

8. The linear differential gain stage as recited in claim 7 wherein the first load resistor has a first terminal coupled to the first output and a second terminal coupled to a first power supply terminal for receiving a first power supply voltage and wherein the second load resistor has a first terminal coupled to the second output and a second terminal coupled to said first power supply terminal.

9. The linear differential gain stage as recited in claim 8 wherein a conductive area of said first and second transistors of said input differential transistor pair and a conductive area of said first and second transistors of the linear differential gain stage are equal.

10. The linear differential gain stage as recited in claim 9 further including:

a first current source having a first terminal coupled to said second electrode of said first transistor of the linear differential gain stage and a second terminal coupled to a second power supply terminal for receiving a second power supply voltage;

a second current source having a first terminal coupled to said second electrode of said second transistor of the linear differential gain stage and a second terminal coupled to said second power supply terminal; and a resistor having a first terminal coupled to said first terminal of said first current source and a second terminal coupled to said first terminal of said second current source.

11. The linear differential gain stage as recited in claim 10 wherein said first impedance compensation circuit comprises:

a first transistor having a first electrode coupled to the second output, a control electrode coupled to the first input, and a second electrode; and a second transistor having a first electrode coupled to said second electrode of said first transistor, a control electrode coupled to said second electrode of said first transistor of said input differential transistor pair, and a second electrode coupled to said second terminal of said resistor.

12. The linear differential gain stage as recited in claim 11 wherein a conductive area of said first and second transistors of said first impedance compensation circuit is equal to said conductive area of said first and second transistors of sash input differential transistor pair.

13. The linear differential gain stage as recited in claim 12 wherein said second impedance compensation circuit comprises:

a first transistor having a first electrode coupled to the first output, a control electrode coupled to the second input, and a second electrode; and a second transistor having a first electrode coupled to said second electrode of said first transistor, a control electrode coupled to said second electrode of said second transistor of said input differential transistor pair, and a second electrode coupled to said first terminal of said resistor.

14. The linear differential gain stage as recited in claim 13 wherein a conductive area of said first and second transistors of said second impedance compensation circuit is equal to said conductive area of said first and second transistors of said input differential transistor pair.

15. A method of canceling a complex impedance of a linear transconductance stage without affecting a gain of the stage, the method comprising the steps of:

generating a first compensation current in response to a change in voltage at a second output;

canceling a first input current of a first input by coupling said first compensation current to the first input;

generating a second compensation current in response to a change in voltage at a first output; and canceling a second input current of a second input by coupling said second compensation current to the second input.

* * * * *